United States Patent
Kwok

(10) Patent No.: US 10,256,842 B2
(45) Date of Patent: Apr. 9, 2019

(54) TECHNOLOGIES FOR CORRECTING FLIPPED BITS FOR AN ERROR CORRECTION DECODE PROCESS

(71) Applicant: Intel Corporation, Santa Clara, CA (US)

(72) Inventor: Zion S. Kwok, Vancouver (CA)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/059,642

(22) Filed: Mar. 3, 2016

(65) Prior Publication Data

US 2017/0257121 A1 Sep. 7, 2017

(51) Int. Cl.
*H03M 13/29* (2006.01)
*H03M 13/11* (2006.01)
*G06F 11/10* (2006.01)

(52) U.S. Cl.
CPC ..... *H03M 13/2927* (2013.01); *G06F 11/1076* (2013.01); *H03M 13/1108* (2013.01)

(58) Field of Classification Search
CPC ................ H03M 13/1105; G06F 11/1012
See application file for complete search history.

(56) References Cited

U.S. PATENT DOCUMENTS

| 5,862,160 A * | 1/1999 | Irvin ................ H04L 1/0057 370/522 |
| 9,575,125 B1 * | 2/2017 | Andre ................ G11C 29/10 |
| 2004/0003165 A1 * | 1/2004 | Schulz ................ G06F 13/1668 711/5 |
| 2004/0003339 A1 * | 1/2004 | Cypher ................ G06F 11/10 714/776 |
| 2013/0215695 A1 | 8/2013 | O'Connell |
| 2013/0332799 A1 * | 12/2013 | Cho ................ G06F 11/1012 714/764 |
| 2014/0136915 A1 | 5/2014 | Hyde et al. |
| 2014/0164879 A1 * | 6/2014 | Tam ................ G06F 11/1012 714/773 |
| 2014/0317460 A1 | 6/2014 | Kleveland et al. |
| 2015/0161004 A1 | 6/2015 | Camp et al. |
| 2016/0099726 A1 * | 4/2016 | Amirkhany ......... H04L 1/0041 714/762 |

FOREIGN PATENT DOCUMENTS

WO 2015-076963 A1 5/2015

OTHER PUBLICATIONS

International Search Report from PCT/US2017/015957, dated May 12, 2017, 2 pages.

* cited by examiner

*Primary Examiner* — Steve N Nguyen
(74) *Attorney, Agent, or Firm* — Barnes & Thornburg LLP

(57) ABSTRACT

Technologies for correcting flipped bits prior to performing an error correction decode process include an apparatus that includes a memory to store a redundant set of codewords and a controller to read data from the memory. The controller selects a codeword from the redundant set of codewords to read from the memory, analyzes the selected codewords to determine whether the codeword contains uncorrectable errors, reads remaining codewords in the redundant set that correspond to the selected codeword, combines the remaining codewords together to generate a rebuilt codeword, flips bits in sections of the rebuilt codeword that differ from the selected codeword by a threshold amount, and performs an error correction decode process based on the rebuilt codeword.

22 Claims, 10 Drawing Sheets

TECHNOLOGIES FOR CORRECTING FLIPPED BITS FOR AN ERROR CORRECTION DECODE PROCESS

BACKGROUND

Some data storage devices, when writing data, may determine whether a particular section of memory is defective and "stuck" to a particular logical value, such as a logical one or zero. When data to be written includes a logical one while the corresponding section of memory is stuck to a logical zero, or vice versa, the data storage device may flip the bits associated with that section of data, and store the flipped bits. In doing so, the data storage device may store an indicator, such as a binary flag, indicating that the section of data in the memory has been flipped due to the defective memory section. Accordingly, when reading the data, the data storage device may detect the indicator and flip the bits associated with the defective section of memory to recreate the original data. However, in some instances, the indicator may be corrupted when the data storage device reads the data, causing the data storage device to incorrectly flip or not flip the bits associated with a particular section of the data. An error correction decode algorithm that receives such data may determine that there are too many errors in the data and subsequently fail.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
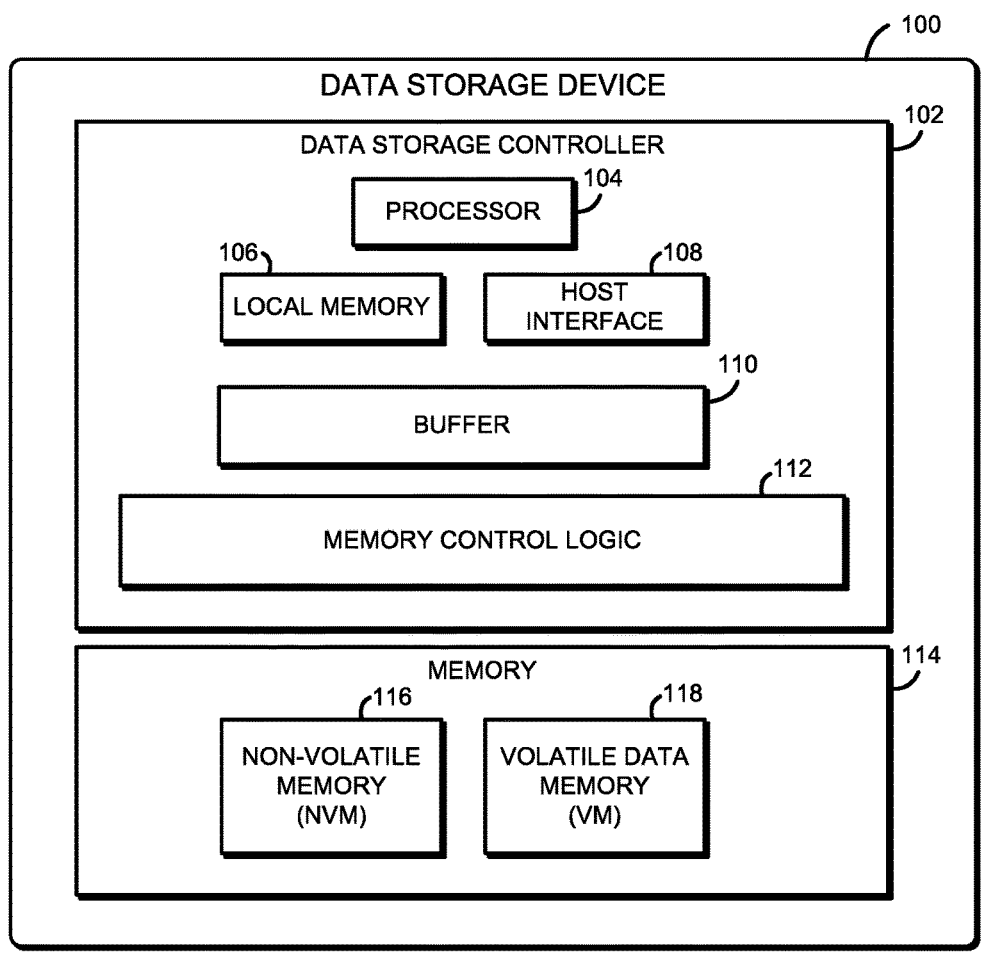
FIG. 1 is a simplified block diagram of at least one embodiment of a data storage device that includes a data storage controller for correcting flipped bits in read data prior to performing an error correction decode process on the data.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

As shown in FIG. 1, an illustrative data storage device 100 for correcting flipped bits in data prior to performing an error correction decode process on the data includes a data storage controller 102 and a memory 114, which illustratively includes non-volatile memory 116 and volatile memory 118. In the illustrative embodiment, a "codeword" is a combination of a data set and parity bits, as described in more detail herein. As discussed in more detail below, during use, the data storage controller 102 is configured to perform a read operation on data, such as a codeword, from redundant data (e.g., redundant codewords) stored in the memory 114. The redundant codewords may be stored using a scheme similar to a redundant array of inexpensive disks (RAID) storage scheme, in which for a selected codeword, the corresponding redundant codewords may be XORed together to recreate or rebuild the selected codeword. The data storage controller 102 may be configured to read a selected codeword, rebuild the codeword by XORing the corresponding redundant codewords, compare sections of the selected codeword with the rebuilt codeword to detect sections that are significantly different from each other (e.g., 90% different), and flip the values of the bits in the selected codeword in those sections. It should be appreciated that the detected sections may have been flipped during an earlier write process to account for memory cells that are "stuck" to a particular logical value, as described above. By flipping the values of the bits in these detected sections back to their original values during the read process, the data storage controller 102 may correct sections of the codeword that an error correction decode process would be otherwise unable to correct. The data storage controller 102 may be configured to then identify any remaining differences between the selected codeword and the rebuilt codeword, generate a combined codeword based on the selected codeword and the rebuilt codeword, with confidence values corresponding to similarities and differences between the selected codeword and the rebuilt codeword, and subsequently perform a "soft" error correction decode process on the combined codeword that takes into account the confidence values as discussed in more detail below.

The data storage device 100 may be embodied as any type device capable of storing data and performing the functions described herein. In the illustrative embodiment, the data storage device 100 is embodied as a solid state drive; however, in other embodiments, the data storage device 100 may embodied as a hard disk drive, a memory module device, a cache memory device, and/or other data storage device.

The data storage controller 102 of the data storage device 100 may be embodied as any type of control device, circuitry, or collection of hardware devices capable of detecting and correcting flipped sections of bits prior to performing an error correction decode process when reading from the memory 114. In the illustrative embodiment, the data storage controller 102 includes a processor or processing circuitry 104, local memory 106, a host interface 108, a buffer 110, and memory control logic (also referred to herein as a "memory controller") 112. The memory controller 112 can be in same die or integrated circuit as the processor 104 or the memory 106, 114 or in a separate die or integrated circuit than those of the processor 104 and the memory 106, 114. In some cases, the processor 104, the memory controller 112, and the memory 106, 114 can be implemented in a single die or integrated circuit. Of course, the data storage controller 102 may include additional devices, circuits, and/or components commonly found in a drive controller of a solid state drive in other embodiments.

The processor 104 may be embodied as any type of processor capable of performing the functions described herein. For example, the processor 104 may be embodied as a single or multi-core processor(s), digital signal processor, microcontroller, or other processor or processing/controlling circuit. Similarly, the local memory 106 may be embodied as any type of volatile and/or non-volatile memory or data storage capable of performing the functions described herein. In the illustrative embodiment, the local memory 106 stores firmware and/or other instructions executable by the processor 104 to perform the described functions of the data storage controller 102. In some embodiments, the processor 104 and the local memory 106 may form a portion of a System-on-a-Chip (SoC) and be incorporated, along with other components of the data storage controller 102, onto a single integrated circuit chip.

The host interface 108 may also be embodied as any type of hardware processor, processing circuitry, input/output circuitry, and/or collection of components capable of facilitating communication of the data storage device 100 with a host device or service (e.g., a host application). That is, the host interface 108 embodies or establishes an interface for accessing data stored on the data storage device 100 (e.g., stored in the memory 114). To do so, the host interface 108 may be configured to utilize any suitable communication protocol and/or technology to facilitate communications with the data storage device 100 depending on the type of data storage device. For example, the host interface 108 may be configured to communicate with a host device or service using Serial Advanced Technology Attachment (SATA), Peripheral Component Interconnect express (PCIe), Serial Attached SCSI (SAS), Universal Serial Bus (USB), and/or other communication protocol and/or technology in some embodiments.

The buffer 110 of the data storage controller 102 is embodied as volatile memory used by data storage controller 102 to temporarily store data that is being read from or written to the memory 114. The particular size of the buffer 110 may be dependent on the total storage size of the memory 114. The memory control logic 112 is illustrative embodied as hardware circuitry and/or device configured to control the read/write access to data at particular storage locations of memory 114.

The non-volatile memory 116 may be embodied as any type of data storage capable of storing data in a persistent manner (even if power is interrupted to non-volatile memory 116). For example, in the illustrative embodiment, the non-volatile memory 116 is embodied as one or more non-volatile memory devices. The non-volatile memory devices of the non-volatile memory 116 are illustratively embodied as three dimensional NAND ("3D NAND") non-volatile memory devices. However, in other embodiments, the non-volatile memory 116 may be embodied as any combination of memory devices that use chalcogenide phase change material (e.g., chalcogenide glass), three-dimensional (3D) crosspoint memory, or other types of byte-addressable, write-in-place non-volatile memory, ferroelectric transistor random-access memory (FeTRAM), nanowire-based non-volatile memory, phase change memory (PCM), memory that incorporates memristor technology, Magnetoresistive random-access memory (MRAM) or Spin Transfer Torque (STT)-MRAM.

The volatile memory 118 may be embodied as any type of data storage capable of storing data while power is supplied volatile memory 118. For example, in the illustrative embodiment, the volatile memory 118 is embodied as one or more volatile memory devices, and is periodically referred to hereinafter as volatile memory 118 with the understanding that the volatile memory 118 may be embodied as other types of non-persistent data storage in other embodiments. The volatile memory devices of the volatile memory 118 are illustratively embodied as dynamic random-access memory (DRAM) devices, but may be embodied as other types of volatile memory devices and/or memory technologies capable of storing data while power is supplied to volatile memory 118.

Figure 2:
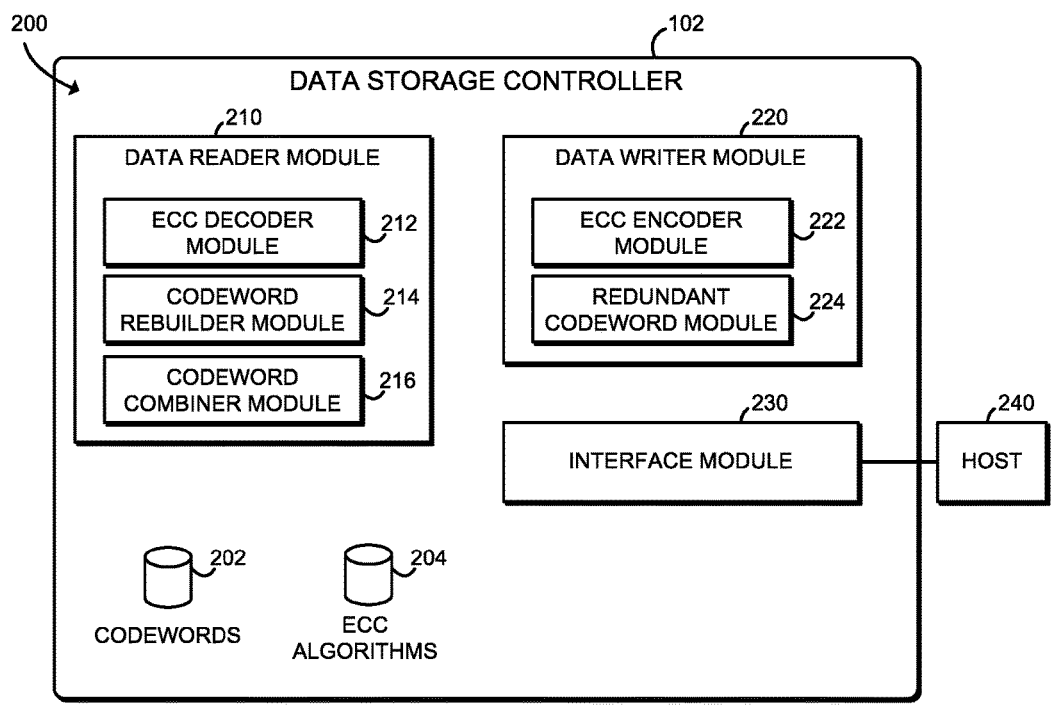
FIG. 2 is a simplified block diagram of at least one embodiment of an environment that may be established by a data storage controller included in the data storage device of FIG. 1.

Referring now to FIG. 2, in use, the data storage controller 102 of the data storage device 100 may establish an environment 200. The illustrative environment 200 includes a data reader module 210, a data writer module 220, and an interface module 230. Each of the modules and other components of the environment 200 may be embodied as firmware, software, hardware, or a combination thereof. For example the various modules, logic, and other components of the environment 200 may form a portion of, or otherwise be established by, the data storage controller 102 or other hardware components of the data storage device 100. As such, in some embodiments, any one or more of the modules of the environment 200 may be embodied as a circuit or collection of electrical devices (e.g., a data reader circuit 210, a data writer circuit 220, an interface circuit 230, etc.). In the illustrative environment 200, the environment 200 includes codewords 202 and error correction code (ECC) algorithms, each of which may be accessed by the various modules and/or sub-modules of the data storage controller 102.

In the illustrative embodiment, the data reader module 210 is configured to read codewords from the memory 114 in response to a read request, to detect and correct any sections with flipped bits by comparing a selected codeword with a rebuilt codeword, combine the selected codeword with the rebuilt codeword, and decode the combined codeword. To do so, the data reader module 210 includes an ECC decoder module 212, a codeword rebuilder module 214, and a codeword combiner module 216. In the illustrative embodiment, the ECC decoder module 212 is configured to perform an error correction decode process, using one of the ECC algorithms 204, on a codeword. The ECC decoder module 212 may also be configured to determine whether the selected codeword contains a number of errors that exceeds a threshold number of errors that the ECC decoder module 212 is able to correct, based on the error correction decode process that the ECC decoder module 212 is configured to perform. In the illustrative embodiment, the ECC decoder module 212 is configured to perform a soft error correction process, that takes into account confidence or certainty values associated with one or more portions in a codeword. In the illustrative embodiment, the soft error correction process may be a low-density parity-check code ("LDPC") error correction process.

In the illustrative embodiment, the codeword rebuilder module 214 is configured to identify redundant codewords stored in the memory 114 that correspond to the selected codeword that is to be read. Further, the codeword rebuilder module 214 may be configured to combine the identified redundant codewords, such as by XORing the redundant codewords together, to obtain a rebuilt codeword. The rebuilt codeword theoretically matches the selected codeword. However, due to potentially defective memory cells in the memory 114, errors in reading the codewords, and/or sections of data where the bits were flipped during a write operation, the rebuilt codeword may differ from the selected codeword in one or more sections.

In the illustrative embodiment, the codeword combiner module 216 is configured to compare the selected codeword to the rebuilt codeword, identify sections in which the selected codeword differs from the rebuilt codeword by a threshold amount (e.g., 90%), flip the bits in the identified sections of the selected codeword that differ from the rebuilt codeword by the threshold amount, and then, after flipping the bits in any such sections, compare the selected codeword to the rebuilt codeword again to identify any remaining differences between the selected codeword and the rebuilt codeword. The codeword combiner module 216 may be further configured to generate a combined codeword based on the comparison between the selected codeword and the rebuilt codeword. In the illustrative embodiment, the codeword combiner module 216 may be configured to store a relatively high confidence value for bits that are the same between the selected codeword and the rebuilt codeword, and store a relatively low confidence value for bits that are different between the selected codeword and the rebuilt codeword. As described above, these confidence values of the combined codeword may then be used by the ECC decoder module 212 to decode the combined codeword and thereby extract the data within the combined codeword in response to the read request.

In the illustrative embodiment, the data writer module 220 is configured to write data to the memory 114 in a manner that enables the data reader module 210 to operate as described above. More specifically, in the illustrative embodiment, the data writer module 220 is configured to detect faulty cells in the memory 114 where a codeword that contains a data set is to be stored, flip the bits in sections of the data set that correspond to the faulty cells, encode the data set using an error correction encode process based on one of the ECC algorithms 204 to generate a complete codeword that contains the data set and parity bits, and store corresponding redundant codewords in the memory 114. To do so, the data writer module 220 includes an ECC encoder module 222 and a redundant codeword module 224. The ECC encoder module 222 may be configured to encode the data set using the error correction encode process, as described above, to generate a complete codeword that includes the data set and associated parity bits. The redundant codeword module 224 is configured to generate and store redundant codewords that correspond to the codeword generated by the ECC encoder module 222. In the illustrative embodiment, the redundant codeword module 224 is configured to store each redundant codeword in a separate physical section of the memory 114, such as on separate dies. Further, in the illustrative embodiment, the redundant codeword module 224 is configured to generate and store the redundant codewords using a scheme that enables all but a selected one of the codewords to be combined to obtain the selected codeword. In the illustrative embodiment, the redundant codeword module 224 generates the redundant codewords such that they can be combined with an XOR operation to obtain the selected codeword. In other words, in the illustrative embodiment, any codeword in the set can be recreated by XORing all of the other corresponding codewords together.

The interface module 230 is configured to handle write requests and read requests received from a host 240, which may be embodied as an application, service, and/or other device. To do so, the interface module 230 may be configured to identify a received request and any data or parameters associated with the request, and transmit these items to the data reader module 210 or the data writer module 220, depending on the type of request. In response to a read request, the interface module 234 may be configured to transmit the data read (i.e., the data from the codeword in memory 114) by the data reader module 210 to the host 240. In response to a write request, the interface module 230 may be configured to transmit a result of the request to the host 240, for example a confirmation that the write request was received and/or completed.

Figure 3:
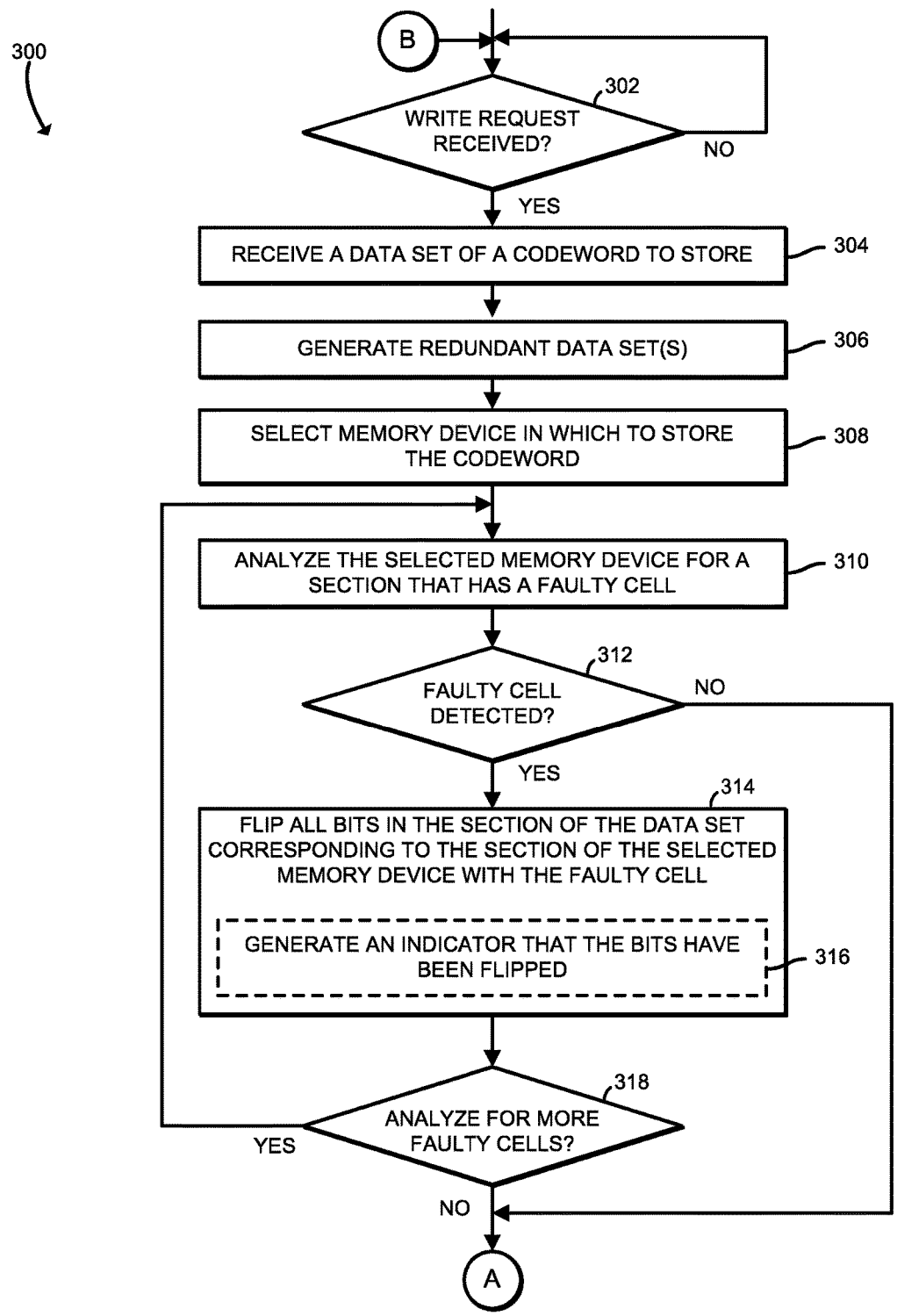
FIGS. 3 and 4 are a simplified flow diagram of at least one embodiment of a method for writing data that may be executed by the data storage device of FIG. 1.

Referring now to FIG. 3, in use, the data storage controller 102 of the data storage device 100 may execute a method 300 for writing data in which the data is encoded in a codeword and in which the bits of one or more sections of the codeword (e.g., sections of the data set in the codeword) may be flipped to compensate for a faulty memory cell of the memory 114. The method 300 begins with block 302 in which the data storage controller 102 determines whether a write request has been received (e.g., from the host 240). If a write request has been received, the method 300 advances to block 304. In block 304, the data storage controller 102 receives a data set to store to the memory 114. For example, in some embodiments, the write instruction may include a memory address to the data set, and the data storage controller 102 accesses the data set from the memory using the address. In other embodiments, such as when the data set is relatively small, the data set may be included as a parameter of the write instruction. As described herein, in the illustrative embodiment, the data set is a portion of a codeword and a complete codeword includes the data set as well as parity bits associated with the data set. In block 306, the data storage controller 102 generates one or more redundant data sets associated with the received data set. The redundant data sets may be combined, such as through an XOR operation, to obtain the data set received in block 304. In block 308, the data storage controller 102 selects a memory device in which to store a codeword that will contain the data set received in block 304. In the illustrative embodiment, the data storage controller 102 may select a location within the non-volatile memory 116 to store the codeword. In block 310, the data storage controller 102 analyzes the selected memory device (e.g., the non-volatile memory 116) for a section that has a faulty cell. For example, the data storage controller 102 may analyze a die of the non-volatile memory 116, where the codeword is to be stored, to determine whether any memory cells are "stuck" at a particular value (e.g., a logical one or zero).

In block 312, if the data storage controller 102 detects a faulty memory cell, the method 300 advances to block 314, in which the data storage controller 102 performs a "flip and write" process. To do so, in the illustrative embodiment, the data storage controller 102 flips the values of all bits in the section of the data set that correspond to the section of the selected memory device with the faulty cell. In the illustrative embodiment, the data storage controller 102 may generate an indicator of whether the bits in the section have been flipped, as indicated in block 316. In the illustrative embodiment, the indicator may be one of the bits in the section of the codeword, such as the first bit or the last bit of the section. In block 318, the data storage controller 102 determines whether to analyze for more faulty cells of the memory device where the codeword is to be stored. In the illustrative embodiment, the data storage controller 102 may analyze every memory cell that will be used to store one of the bits of the data set of the codeword. If the data storage controller 102 determines to analyze the memory device for more faulty cells, the method 300 loops back to block 310 to analyze another faulty memory cell in the memory device. As an example of the above process, if the data set of the codeword contains a first section having the values "00000" and a second section containing the values "00000", and the memory cell selected to store the first zero of the second section is stuck at the value "1", the data storage controller 102 may flip the bits in the second section, such that the values are "11111". Accordingly, in the present example, the first and second sections of the data set of the codeword are "00000" and "11111" respectively. In some embodiments, the data storage controller 102 may perform the above analysis and flip and write operations for each of the redundant data sets as well.

Figure 4:
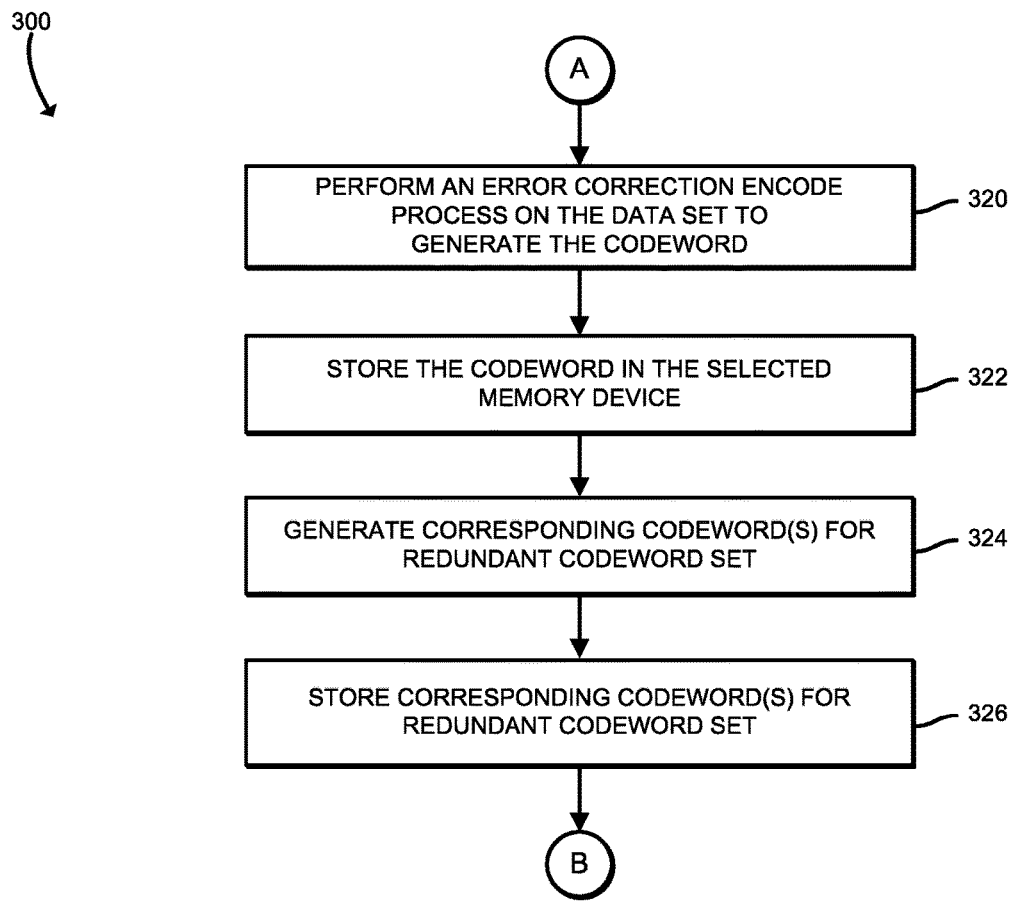

If the data storage controller does not detect any faulty cells in block 312 or determines not to analyze for more faulty cells in block 318, the method 300 advances to block 320 of FIG. 4, in which the data storage controller 102 performs an error correction encode process on the data set to generate a complete codeword that includes both the data set and parity bits. Accordingly, in the illustrative embodiment, the codeword may later be decoded using the parity bits to obtain the data set. Further, in the illustrative embodiment, the data storage controller 102 may encode the data set such that the resulting codeword may be decoded using a soft error correction decode process, such as a low-density parity-check process, to obtain the data set. In block 322, the data storage controller 102 stores the codeword in the selected memory device (e.g., in the non-volatile memory 116). In block 324, the data storage controller 102 generates corresponding codewords for each redundant codeword set to be stored. As described above, in the illustrative embodiment, a complete codeword includes a data set and parity bits. Accordingly, in the illustrative embodiment, the data storage controller 102 may perform an error correction encode process on each of the redundant data sets generated in block 306 to obtain corresponding parity bits, thereby generating each redundant codeword. In the illustrative embodiment, when combined together such as in an XOR operation, the redundant codewords will provide the data set of the codeword generated in step 320. In block 326, the data storage controller 102 stores the corresponding codewords for the redundant codeword set in the memory 114, such as at various physical locations in the non-volatile storage 116. After the data storage controller 102 stores the corresponding codewords of the redundant codeword set, the method 300 loops back to block 302 to await another data write instruction.

Figure 5:
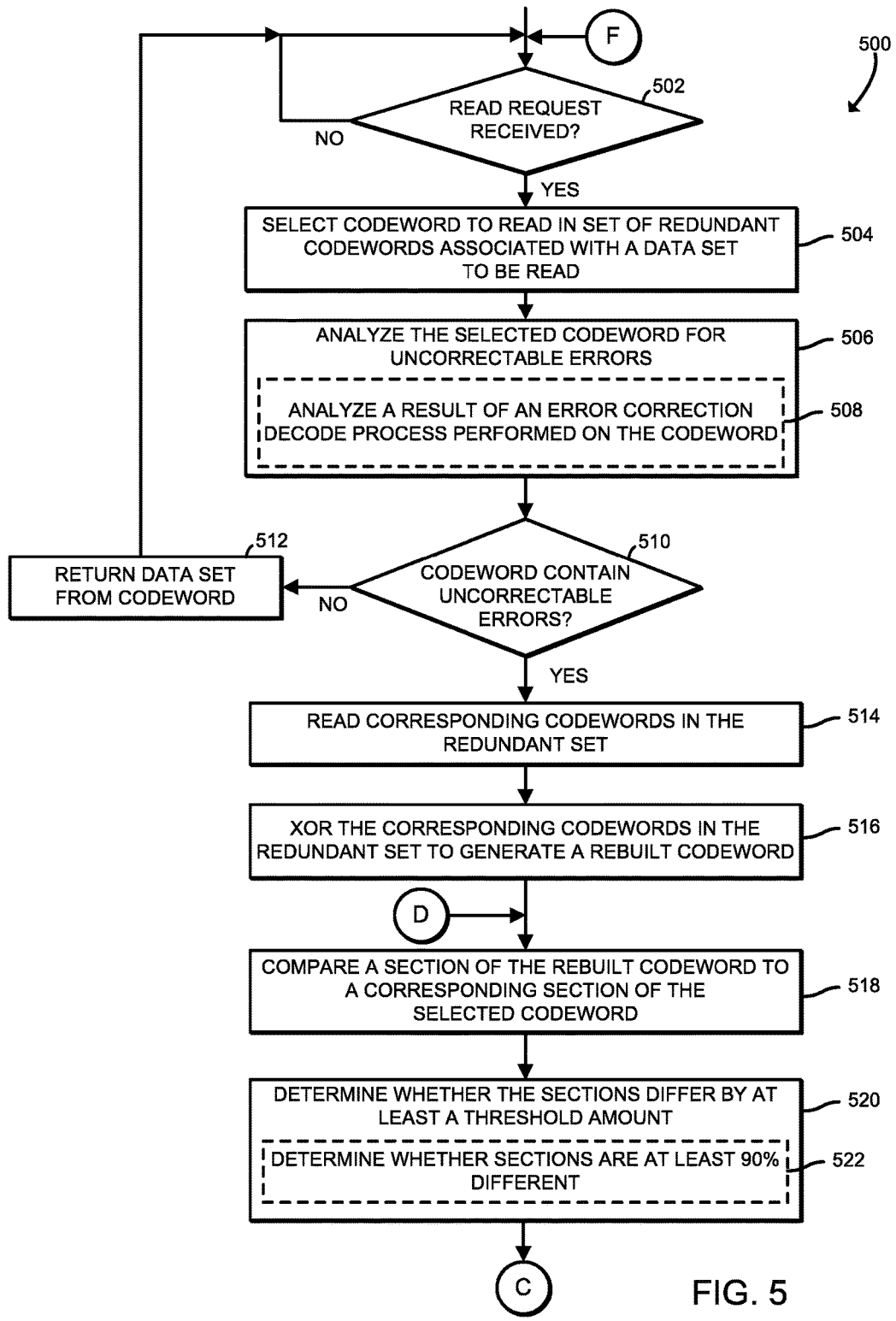
FIGS. 5-7 are a simplified flow diagram of at least one embodiment of a method for reading data that may be executed by the data storage controller of FIG. 1.

Referring now to FIG. 5, in use, the data storage controller 102 of the data storage device 100 may execute a method 400 for reading data that takes into account the potential flip and write operations that may have occurred when the data was written in the method 300, and to compensate for potential corruption of the data that may have occurred between the time the data was written and when it is read. The method 500 begins in block 502 in which the data storage controller 102 determines whether a read request has been received (e.g., from the host 240). In some embodiments, the read request may specify an address of a data set to read from the memory 114 (e.g., the non-volatile memory 116). If such a read request is received, the method 500 advances to block 504 in which the data storage controller 102 selects the codeword to read from the set of redundant codewords associated with the data set to be read. As described above, during the data write process, the codewords are generated to encode the data set, such that the codeword may be decoded to obtain the data set.

In block 506, the data storage controller 102 analyzes the selected codeword for uncorrectable errors. In the illustrative embodiment, as indicated in block 508, the data storage controller 102 may analyze a result of an attempted error correction decode process on the codeword to determine whether the selected codeword contains uncorrectable errors. For example, if the attempted error correction decode process fails, then the selected codeword may contain uncorrectable errors. At least some ECC algorithms 204 are limited in the number of errors they can correct. Accordingly, in such embodiments, if a codeword has more errors than the amount of errors that the ECC algorithm 204 is capable of correcting, then the codeword contains uncorrectable errors. In block 510, the data storage controller 102 determines whether the codeword contains uncorrectable errors. If not, the method 500 advances to block 512 in which the data storage controller 102 decodes the codeword to extract the data set in response to the read request, and loops back to block 502 to await another read request. However, referring back to block 510, if the data storage controller 102 determines that the codeword does contain uncorrectable errors, the method 500 advances to block 514 in which the data storage controller 102 reads the corresponding codewords in the redundant set. In the illustrative embodiment, the data storage controller 102 may maintain a table of memory locations where each of the codewords in a redundant set of codewords is stored. Accordingly, in the illustrative embodiment, the data storage controller 102 may reference the table to locate and read the redundant codewords.

In block 516, the data storage controller 102 combines the corresponding codewords in the redundant set, such as by XORing them together, to generate a rebuilt codeword. As described above, the redundant codewords are generated in the data write method 300 such that, when combined, they provide the selected codeword. Accordingly, the rebuilt codeword theoretically is exactly equal to the selected codeword. However, in practice, the selected codeword may contain sections that were flipped, due to faulty memory cells, and may have other portions that were corrupted. Likewise, the redundant codewords may have similar corruptions. Regardless, once any sections containing flipped values have been addressed, the selected codeword and the redundant codeword are substantially similar In the illustrative embodiment, at least about 90% of the bits in the selected codeword will match the corresponding bits of the rebuilt codeword.

In block 518, the data storage controller 102 compares a section of the rebuilt codeword to a corresponding section of the selected codeword. For example, the data storage controller 102 may compare a first section of the rebuilt codeword to the first section of the selected codeword. In block 520, the data storage controller 102 determines whether the compared sections differ by at least a threshold amount. In the illustrative embodiment, the data storage controller 102 may determine whether the sections are at least 90% different, meaning that 90% of the bits in the section of the rebuilt codeword differ from the corresponding bits of the section of the selected codeword.

Figure 6:
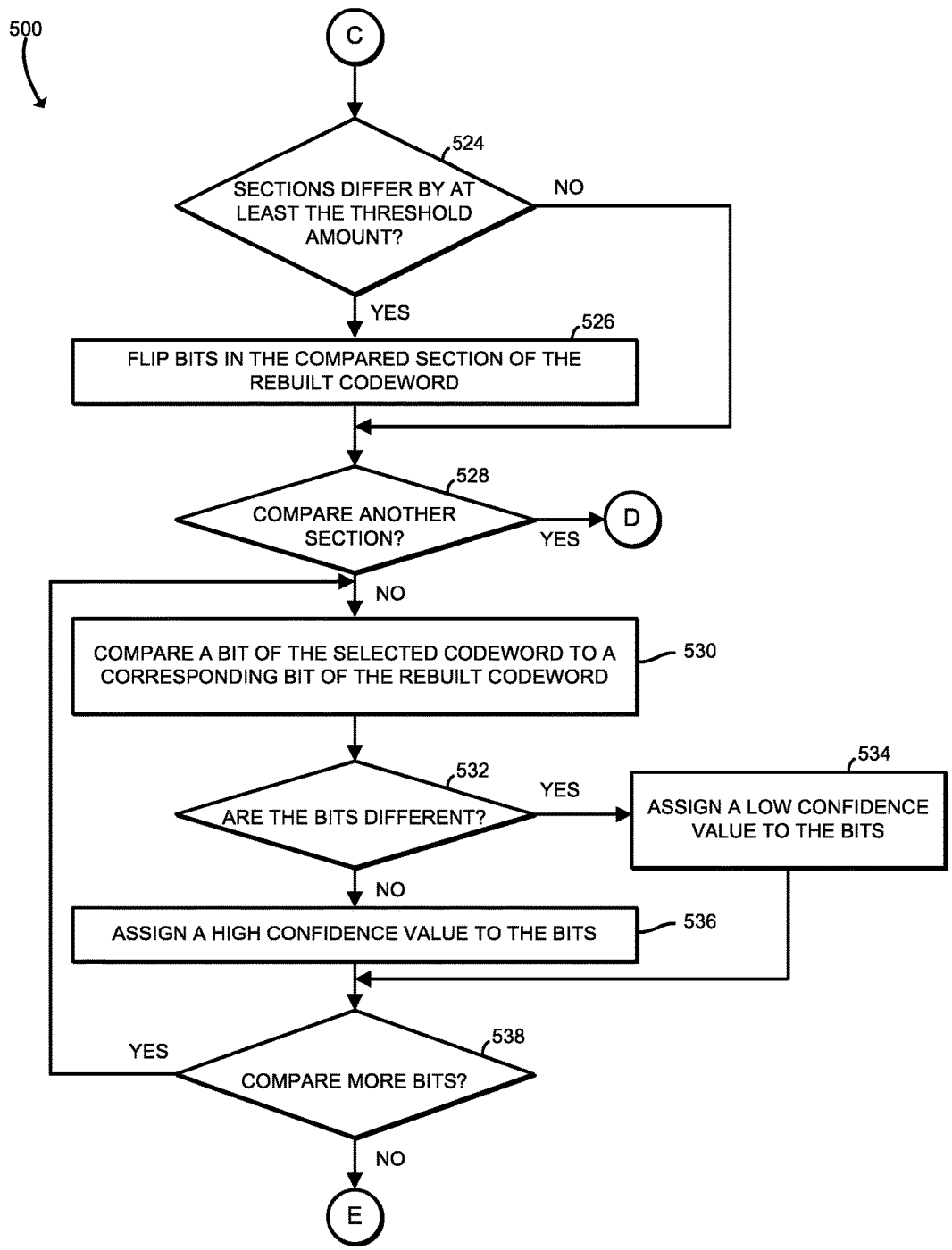

In block 524 of FIG. 6, the data storage controller 102 determines whether the compared sections differ by at least the threshold amount. If so, the data storage controller 102 flips the values of the bits in the compared section of the rebuilt codeword, as indicated in block 526. In other words, based on the assumption that the rebuilt codeword and the selected codeword should be at least about 90% the same, when a section of the selected codeword is more than 90% different from the corresponding section of the rebuilt codeword, the selected codeword must have had its bits flipped in that section during a flip and write operation in the data write method 300, to compensate for a faulty memory cell. By performing the above comparison to determine whether the bits were previously flipped, the data storage controller 102 need not rely on a stored indicator of whether the bits in that section were previously flipped. This is advantageous because the value of such an indicator could be corrupted. After flipping the bits in block 526, or if the data storage controller 102 determined that the sections do not differ by the threshold amount in block 524, the method 500 advances to block 528, in which the data storage controller 102 determines whether to compare another section of the rebuilt codeword to the selected codeword.

In the illustrative embodiment, the data storage controller 102 may compare all of the sections of the rebuilt codeword to the corresponding sections of the selected codeword. If the data storage controller 102 determines to compare another section, the method 500 loops back to block 518 of FIG. 5, to compare the next section of the rebuilt codeword to the corresponding section of the selected codeword and the above-described process is repeated. However, if the data storage controller 102 determines, in block 528, not to compare another section (e.g., if all of the sections have been compared), the method 500 advances to block 530, in which the data storage controller 102 compares a bit of the selected codeword to a corresponding bit of the rebuilt codeword. In block 532, the data storage controller 102 determines whether the compared bits are different. If the compared bits are different, the method 500 advances to block 534, in which the data storage controller 102 assigns a low confidence value to the bits. If the compared bits are the not different, then the method instead advances to block 536, in which the data storage controller 102 assigns a high confidence value to the bits. In the illustrative embodiment, a low confidence value may be a decimal number that is closer to the middle between a logical zero and a logical one (e.g., 0.4) while a high confidence value may be a decimal number that is closer to a logical one than to a logical zero (e.g., 0.9). In block 538, the data storage controller 102 determines whether to compare additional bits. If so, the method loops back to block 530 to compare the next bit of the selected codeword to the corresponding bit of the rebuilt codeword. In the illustrative embodiment, the method 500 repeats the loop until the data storage controller 102 determines not to compare any more bits. In some embodiments, the data storage controller 102 may compare only the bits of the data sets included in the codewords, and not compare the parity bits. In other embodiments, the data storage controller 102 may compare all of the bits of the codewords.

Figure 7:
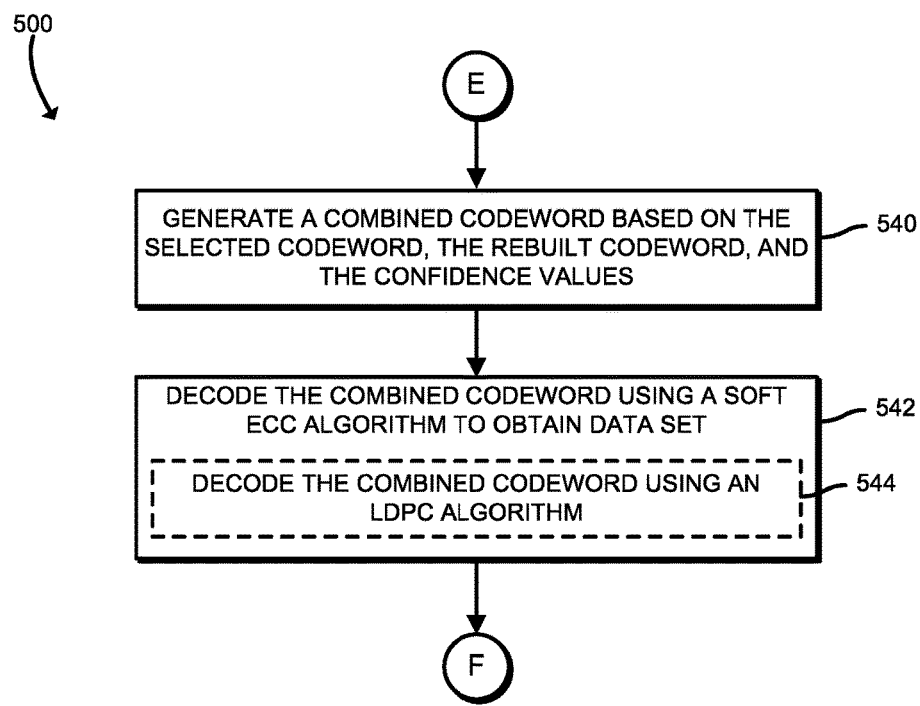

After the bits of the rebuilt codeword have been compared, the method 500 advances to block 540 of FIG. 7 in which the data storage controller 102 generates a combined codeword based on the selected codeword, the rebuilt codeword, and the confidence values. In the illustrative embodiment, the combined codeword may be embodied as the confidence values generated in blocks 534 and 536. In some embodiments, the data storage controller 102 may average the selected codeword with the rebuilt codeword to generate combined codeword. In block 542, the data storage controller 102 decodes the combined codeword using a "soft" ECC algorithm 204 to obtain the data set. A soft ECC algorithm uses confidence data associated with a codeword, such as the confidence values generated in the method 500, to more accurately decode data from a codeword than an ECC algorithm that does not use confidence data. As an example, in the illustrative embodiment, the data storage controller 102 may decode the combined codeword using a low-density parity-check (LDPC) algorithm to obtain the data set, as indicated in block 544. After the data set has been obtained to satisfy the data read request, the method 500 loops back to block 502 to await another data read request.

Figure 8:
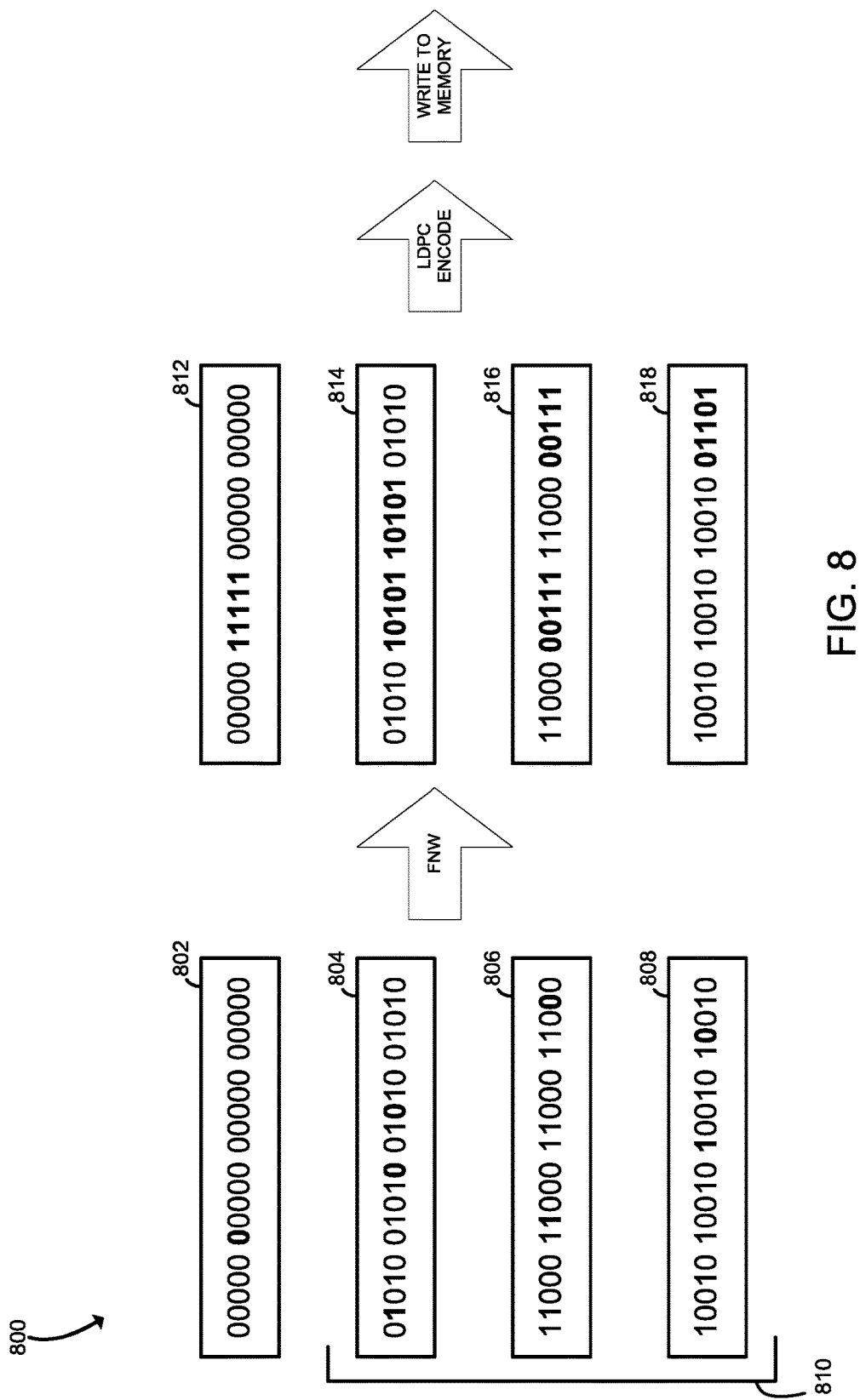
FIG. 8 is a simplified block diagram of example data written to memory by the data storage device of FIG. 1.

Referring now to FIG. 8, a simplified block diagram 800 of data that may be written to the memory 114 (e.g., the non-volatile memory 116) during execution of the method 300 is shown. In the illustrative embodiment, a codeword 802 includes a first section having the values "00000", a second section having the values "00000", a third section having the values "00000", and a fourth section having the values "00000". The sections of the codeword may be sections of the data set of the codeword 802 described above with reference to the method 300. The data storage controller 102 may select a location, such as a particular die of the non-volatile memory 116 for storage of the codeword 802. The data storage controller 102 may select different physical locations in the memory (e.g., various other dies of the non-volatile memory 116) for storage of corresponding redundant codewords 804, 806, 808 in a redundant codeword set 810. As described above, the corresponding redundant codewords 810 are configured such that, when combined, such as through an XOR operation, the result is the codeword 802. The data storage controller 102 may detect that a memory cell where the first zero of the second section of the codeword 802 is faulty, as it is "stuck" to a logical one, and cannot store a logical zero. Accordingly, the data storage controller 102 may flip the bits of the second section of the codeword 802, such that the second section is "11111", rather than "00000". The result of the flip operation is the codeword 812. In the illustrative embodiment, the last bit (i.e., the rightmost bit) in the second section of the codeword 812 is an indicator that the bits in the second section have been flipped. As shown, the indicator is set to a logical one. Similarly, the data storage controller 102 may flip the bits of the redundant codewords 810 as needed to compensate for any faulty memory cells. The resulting codewords 814, 816, 818 contain the flipped bits. The data storage controller 102 may then generate ECC parity bits for use in later decoding the codewords, and write the codewords to the memory 114 (e.g., to the non-volatile memory 116).

Figure 9:
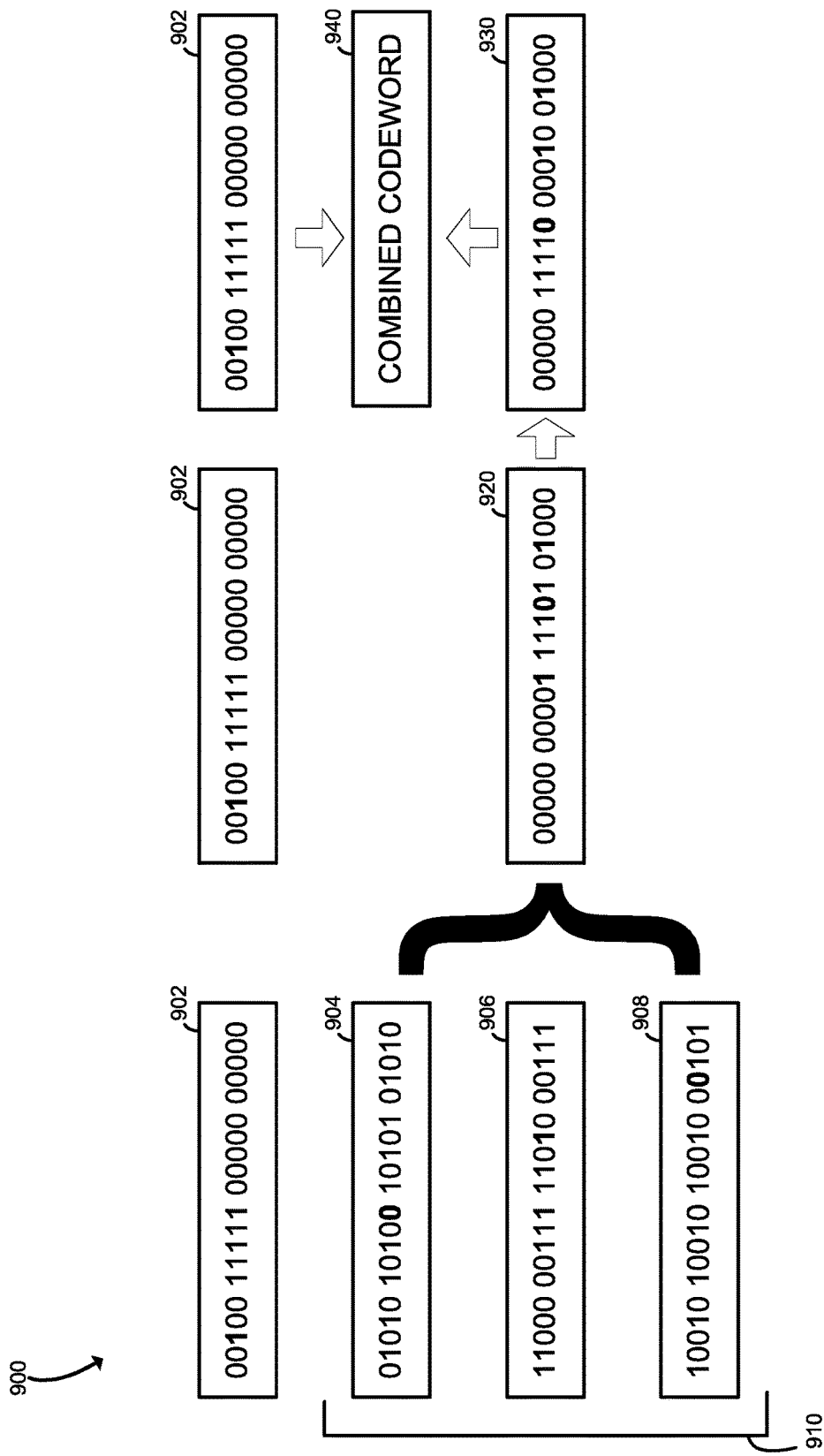
FIG. 9 is a simplified block diagram of example data read from memory by the data storage device of FIG. 1.

Referring now to FIG. 9, a simplified block diagram 900 of data that may be read from the memory 114 (e.g., the non-volatile memory 116) during execution of the method 500 is shown. In the illustrative embodiment, a codeword 902, corresponding to the codeword 802, is read from the memory 114, in response to a data read request. Similarly, redundant codewords 904, 906, 908 in the redundant codeword set 910 are read from the memory 114. The redundant codeword set 910 corresponds to the redundant codeword set 810 of FIG. 8. While the codewords were stored in the memory 114 and/or during the read operation, some of the values in the codewords were inadvertently corrupted. The illustrative data storage controller 102 may combine the redundant set of codewords 910, for example through an XOR operation, to produce the rebuilt codeword 920. Additionally, the illustrative data storage controller 102 may compare the sections of the codeword 902 to corresponding sections of the rebuilt codeword 920 to identify the sections that differ by a threshold amount (e.g., 90%). These sections represent bits that were flipped in the flip and write operation described above, with reference to FIG. 8. As shown, the data storage controller 102 determines that the second and third sections of the rebuilt codeword 920 differ from the codeword 902 by at least the threshold amount, and flips the bits in those sections to produce the revised rebuilt codeword 930.

Subsequently, the illustrative data storage controller 102 compares the bits of the revised rebuilt codeword 930 to the corresponding bits of the codeword 902 to generate a combined codeword 940 with confidence values. For example, the combined codeword 940 may include a relatively low confidence value associated with the third bit in the first section because the third bit in the first section of the codeword 902 is a logical one while the third bit in the first section of the revised rebuilt codeword 930 is a logical zero. After all of the confidence values for the combined codeword 940 are established, the illustrative data storage controller 102 may perform a soft error correction decode process, such as a low-density parity-check (LDPC) process on the combined codeword 940 to obtain the encoded data for the data read request.

Figure 10:
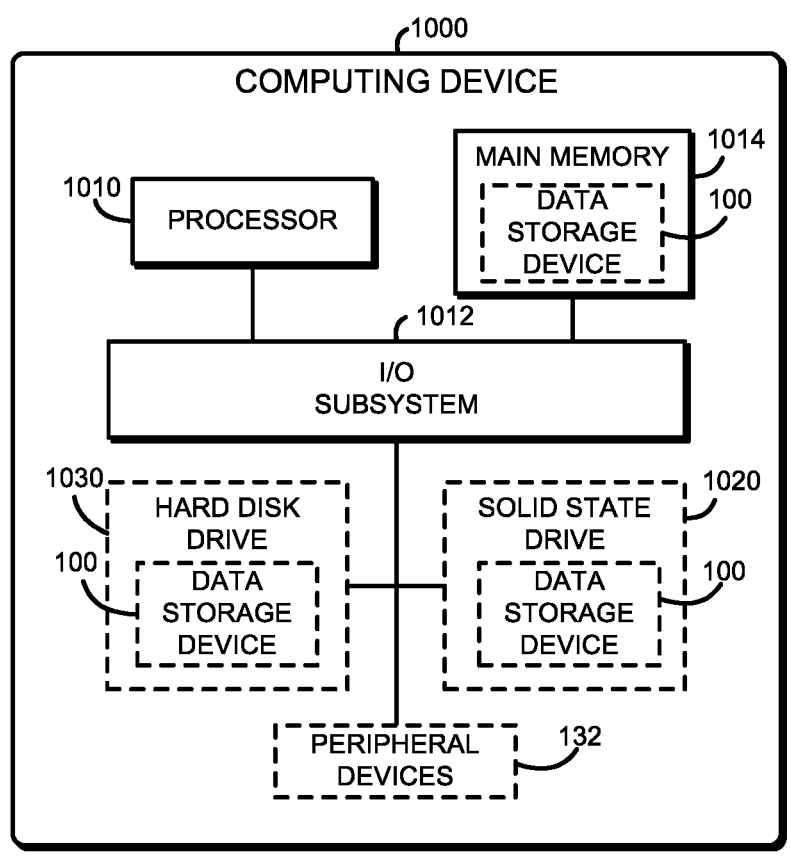
FIG. 10 is a simplified block diagram of at least one embodiment of a computing device including the data storage device of FIG. 1.

Referring now to FIG. 10, in some embodiments, the data storage device 100 may be incorporated in, or form a portion of, a computing device or other apparatus 1000. The computing device 1000 may be embodied as any type of computing device in which the data storage device 100 may be used. For example, the computing device 1000 may be embodied as a smart phone, a tablet computer, a notebook, a laptop computer, a netbook, an Ultrabook™, a wearable computing device, a pair of smart glasses, a head-mounted computing device, a cellular phone, a desktop computer, a smart device, a personal digital assistant, a mobile Internet device, a server, a data storage device, and/or any other computing/communication device. As shown in FIG. 10, the illustrative computing device 1000 includes a processor 1010, an input/output ("I/O") subsystem 1012, and a main memory 1014. Of course, the computing device 1000 may include other or additional components, such as those commonly found in a typical computing device (e.g., various input/output devices and/or other components), in other embodiments. Additionally, in some embodiments, one or more of the illustrative components may be incorporated in, or otherwise form a portion of, another component. For example, the memory 1014, or portions thereof, may be incorporated in the processor 1010 in some embodiments.

The processor 1010 may be embodied as any type of processor capable of performing the functions described herein. For example, the processor 1010 may be embodied as a single or multi-core processor(s), digital signal processor, microcontroller, or other processor or processing/controlling circuit. Similarly, the memory 1014 may be embodied as any type of volatile or non-volatile memory or data storage capable of performing the functions described herein. In operation, the memory 1014 may store various data and software used during operation of the computing device 1000 such as operating systems, applications, programs, libraries, and drivers. The memory 1014 is communicatively coupled to the processor 1010 via the I/O subsystem 1012, which may be embodied as circuitry and/or components to facilitate input/output operations with the processor 1010, the memory 1014, and other components of the computing device 1000. For example, the I/O subsystem 1012 may be embodied as, or otherwise include, memory controller hubs, input/output control hubs, firmware devices, communication links (i.e., point-to-point links, bus links, wires, cables, light guides, printed circuit board traces, etc.) and/or other components and subsystems to facilitate the input/output operations.

As shown in FIG. 10, the data storage device 100 may be incorporated in, or form a portion of, one or more other components of the computing device 1000. For example, the data storage device 100 may be embodied as, or otherwise be included in, the main memory 1014. Additionally or alternatively, the data storage device 100 may be embodied as, or otherwise included in, a solid state drive 1020 of the computing device 1000. Further, in some embodiments, the data storage device 100 may be embodied as, or otherwise included in, a hard disk drive 1030 of the computing device 1000. Of course, in other embodiments, the data storage device 100 may be included in or form a portion of other components of the computing device 1000.

Reference to memory devices can apply to different memory types, and in particular, any memory that has a bank group architecture. Memory devices generally refer to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR4 (DDR version 4, initial specification published in September 2012 by JEDEC), DDR4E (in development by JEDEC), LPDDR4 (LOW POWER DOUBLE DATA RATE (LPDDR) version 4, JESD209-4, originally published by JEDEC in August 2014), WI02 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (currently in discussion by JEDEC), HBM2 (HBM version 2), currently in discussion by JEDEC), and/or others, and technologies based on derivatives or extensions of such specifications.

In addition to, or alternatively to, volatile memory, in one embodiment, reference to memory devices can refer to a nonvolatile memory device whose state is determinate even if power is interrupted to the device.

EXAMPLES

Illustrative examples of the technologies disclosed herein are provided below. An embodiment of the technologies may include any one or more, and any combination of, the examples described below.

Example 1 includes an apparatus comprising a memory to store a set of redundant codewords; and a controller to read data from the memory, wherein the controller is to compare a first codeword associated with the set of redundant codewords to a second codeword associated with the set of redundant codewords to determine whether a section of the first codeword differs from a corresponding section of the second codeword by at least a predefined threshold amount; flip, in response to a determination that the section of the first codeword differs from the corresponding section of the second codeword by at least the predefined threshold amount, one or more bits in the section of the first codeword; and perform an error correction decode process based on the first codeword.

Example 2 includes the subject matter of Example 1, and wherein the controller is further to select, in response to a read request, the second codeword from the redundant set of codewords, to read from the memory; analyze the selected codeword to determine whether the selected codeword contains uncorrectable errors; read, in response to a determination that the selected codeword contains uncorrectable errors, remaining codewords in the redundant set, wherein the remaining codewords correspond to the selected codeword; and XOR the remaining codewords together to generate a rebuilt codeword, wherein the rebuilt codeword is the first codeword, wherein to flip one or more bits in the section of the rebuilt codeword comprises to flip every bit in the section of the rebuilt codeword.

Example 3 includes the subject matter of any of Examples 1 and 2, and wherein the controller is further to compare the rebuilt codeword to the selected codeword to determine differences between the rebuilt codeword and the selected codeword; and generate a combined codeword based on the comparison of the rebuilt codeword and the selected codeword, wherein the combined codeword includes confidence information in which bits that differ between the combined codeword and the selected codeword are assigned a low confidence value and bits that do not differ are assigned a high confidence value; and wherein to perform an error correction decode process based on the rebuilt codeword comprises to perform the error correction decode process based on the combined codeword.

Example 4 includes the subject matter of any of Examples 1-3, and wherein to generate the combined codeword comprises to average the selected codeword with the rebuilt codeword.

Example 5 includes the subject matter of any of Examples 1-4, and wherein to perform the error correction decode process comprises to perform a low-density parity-check (LDPC) error correction decode process.

Example 6 includes the subject matter of any of Examples 1-5, and wherein to analyze the selected codeword to determine whether the selected codeword contains uncorrectable errors comprises to perform an error correction decode process on the selected codeword; and analyze a result of the error correction decode process.

Example 7 includes the subject matter of any of Examples 1-6, and wherein the controller is further to write, in response to a write request received before the read request, the redundant set of codewords to the memory, wherein any codeword in the redundant set is equal to an XOR of every other codeword in the redundant set.

Example 8 includes the subject matter of any of Examples 1-7, and wherein the controller is further to receive a write request prior to the read request; determine that at least one cell in the memory is faulty; determine a section in the selected codeword that corresponds to the faulty cell; flip the values of every bit in the determined section of the selected codeword; and write, in response to the write request, the selected codeword to the memory.

Example 9 includes the subject matter of any of Examples 1-8, and wherein the controller is further to store an indicator that the values have been flipped in the determined section.

Example 10 includes the subject matter of any of Examples 1-9, and wherein the controller is further to perform an error correction encode process on a data set associated with the write request to generate the selected codeword.

Example 11 includes the subject matter of any of Examples 1-10, and wherein to perform the error correction encode process comprises to perform an LDPC error correction encode process.

Example 12 includes the subject matter of any of Examples 1-11, and wherein the predefined threshold amount is 90 percent.

Example 13 includes the subject matter of any of Examples 1-12, and wherein the memory is non-volatile memory.

Example 14 includes a method comprising comparing, by a controller of an apparatus, a first codeword associated with a redundant set of codewords stored in a memory of the apparatus to a second codeword associated with the set of redundant codewords to determine whether a section of the first codeword differs from a corresponding section of the second codeword by at least a predefined threshold amount; flipping, by the controller and in response to a determination that the section of the first codeword differs from the corresponding section of the second codeword by at least the predefined threshold amount, one or more bits in the section of the first codeword; and performing, by the controller, an error correction decode process based on the first codeword.

Example 15 includes the subject matter of Example 14, further including selecting, by the controller and in response to a read request, the second codeword from the redundant set of codewords, to read from the memory; analyzing, by the controller, the selected codeword to determine whether the selected codeword contains uncorrectable errors; reading, by the controller and in response to a determination that the selected codeword contains uncorrectable errors, remaining codewords in the redundant set, wherein the remaining codewords correspond to the selected codeword; and XORing, by the controller, the remaining codewords together to generate a rebuilt codeword, wherein the rebuilt codeword is the first codeword, wherein flipping one or more bits in the section of the rebuilt codeword comprises flipping every bit in the section of the rebuilt codeword.

Example 16 includes the subject matter of any of Examples 14 and 15, further including comparing, by the controller, the rebuilt codeword to the selected codeword to determine differences between the rebuilt codeword and the selected codeword; and generating, by the controller, a combined codeword based on the comparison of the rebuilt codeword and the selected codeword, wherein the combined codeword includes confidence information in which bits that differ between the combined codeword and the selected codeword are assigned a low confidence value and bits that do not differ are assigned a high confidence value; and wherein performing an error correction decode process based on the rebuilt codeword comprises performing the error correction decode process based on the combined codeword.

Example 17 includes the subject matter of any of Examples 14-16, and wherein generating the combined codeword comprises averaging the selected codeword with the rebuilt codeword.

Example 18 includes the subject matter of any of Examples 14-17, and wherein performing the error correction decode process comprises performing a low-density parity-check (LDPC) error correction decode process.

Example 19 includes the subject matter of any of Examples 14-18, and wherein analyzing the selected codeword to determine whether the selected codeword contains uncorrectable errors comprises performing, by the controller, an error correction decode process on the selected codeword; and analyzing, by the controller, a result of the error correction decode process.

Example 20 includes the subject matter of any of Examples 14-19, further including writing, by the controller and in response to a write request received before the read request, the redundant set of codewords to the memory, wherein any codeword in the redundant set is equal to an XOR of every other codeword in the redundant set.

Example 21 includes the subject matter of any of Examples 14-20, further including receiving, by the controller, a write request prior to the read request; determining, by the controller, that at least one cell in the memory is faulty; determining, by the controller, a section in the selected codeword that corresponds to the faulty cell; flipping, by the controller, the values of every bit in the determined section of the selected codeword; and writing, by the controller and in response to the write request, the selected codeword to the memory.

Example 22 includes the subject matter of any of Examples 14-21, further including storing, by the controller, an indicator that the values have been flipped in the determined section.

Example 23 includes the subject matter of any of Examples 14-22, further including performing, by the controller, an error correction encode process on a data set associated with the write request to generate the selected codeword.

Example 24 includes the subject matter of any of Examples 14-23, and wherein performing the error correction encode process comprises performing an LDPC error correction encode process.

Example 25 includes the subject matter of any of Examples 14-24, and wherein the predefined threshold amount is 90 percent.

Example 26 includes the subject matter of any of Examples 14-25, further including reading, by the controller, the selected codeword from a non-volatile memory of the apparatus.

Example 27 includes one or more machine-readable storage media comprising a plurality of instructions stored thereon that, when executed, cause an apparatus to perform the method of any of Examples 14-26.

Example 28 includes an apparatus comprising means for comparing a first codeword associated with a redundant set of codewords stored in a memory of the apparatus to a second codeword associated with the set of redundant codewords to determine whether a section of the first codeword differs from a corresponding section of the second codeword by at least a predefined threshold amount; means for flipping, in response to a determination that the section of the first codeword differs from the corresponding section of the second codeword by at least the predefined threshold amount, one or more bits in the section of the first codeword; and means for performing an error correction decode process based on the first codeword.

Example 29 includes the subject matter of Example 28, further including means for selecting, in response to a read request, the second codeword from the redundant set of codewords, to read from the memory; means for analyzing the selected codeword to determine whether the selected codeword contains uncorrectable errors; means for reading, in response to a determination that the selected codeword contains uncorrectable errors, remaining codewords in the redundant set, wherein the remaining codewords correspond to the selected codeword; and means for XORing the remaining codewords together to generate a rebuilt codeword, wherein the rebuilt codeword is the first codeword, wherein the means for flipping one or more bits in the section of the rebuilt codeword comprises means for flipping every bit in the section of the rebuilt codeword.

Example 30 includes the subject matter of any of Examples 28 and 29, further including means for comparing the rebuilt codeword to the selected codeword to determine differences between the rebuilt codeword and the selected codeword; means for generating a combined codeword based on the comparison of the rebuilt codeword and the selected codeword, wherein the combined codeword includes confidence information in which bits that differ between the combined codeword and the selected codeword are assigned a low confidence value and bits that do not differ are assigned a high confidence value; and wherein the means for performing an error correction decode process based on the rebuilt codeword comprises means for performing the error correction decode process based on the combined codeword.

Example 31 includes the subject matter of any of Examples 28-30, and wherein the means for generating the combined codeword comprises means for averaging the selected codeword with the rebuilt codeword.

Example 32 includes the subject matter of any of Examples 28-31, and wherein the means for performing the error correction decode process comprises means for performing a low-density parity-check (LDPC) error correction decode process.

Example 33 includes the subject matter of any of Examples 28-32, and wherein the means for analyzing the selected codeword to determine whether the selected codeword contains uncorrectable errors comprises means for performing an error correction decode process on the selected codeword; and means for analyzing a result of the error correction decode process.

Example 34 includes the subject matter of any of Examples 28-33, further including means for writing, in response to a write request received before the read request, the redundant set of codewords to the memory, wherein any codeword in the redundant set is equal to an XOR of every other codeword in the redundant set.

Example 35 includes the subject matter of any of Examples 28-34, further including means for receiving a write request prior to the read request; means for determining that at least one cell in the memory is faulty; means for determining a section in the selected codeword that corresponds to the faulty cell; means for flipping the values of every bit in the determined section of the selected codeword; and means for writing, in response to the write request, the selected codeword to the memory.

Example 36 includes the subject matter of any of Examples 28-35, further including means for storing an indicator that the values have been flipped in the determined section.

Example 37 includes the subject matter of any of Examples 28-36, further including means for performing an error correction encode process on a data set associated with the write request to generate the selected codeword.

Example 38 includes the subject matter of any of Examples 28-37, and wherein the means for performing the error correction encode process comprises means for performing an LDPC error correction encode process.

Example 39 includes the subject matter of any of Examples 28-38, wherein the predefined threshold amount is 90 percent.

Example 40 includes the subject matter of any of Examples 28-39, further including means for reading the selected codeword from a non-volatile memory of the apparatus.

The invention claimed is:

1. An apparatus comprising:
a memory to store a set of redundant codewords; and
a controller to read data from the memory, wherein the controller is to:
compare, in response to a read request, a first codeword associated with the set of redundant codewords to a second codeword selected from the set of redundant codewords to determine whether a section of the first codeword differs from a corresponding section of the second codeword by at least a predefined threshold amount, wherein the first codeword is generated from an XOR of remaining codewords in the redundant set, other than the second codeword, in response to a determination that the second codeword contains uncorrectable errors;
flip, in response to a determination that the section of the first codeword differs from the corresponding section of the second codeword by at least the predefined threshold amount, every bit in the section of the first codeword to produce a revised codeword; and
perform an error correction decode process based on the revised codeword.

2. The apparatus of claim 1, wherein the controller is further to:
compare the revised codeword to the second codeword to determine differences between the revised codeword and the second codeword; and
generate a combined codeword based on the comparison of the revised codeword and the second codeword, wherein the combined codeword includes confidence information in which bits that differ between the combined codeword and the second codeword are assigned a low confidence value and bits that do not differ are assigned a high confidence value; and
wherein to perform an error correction decode process based on the revised codeword comprises to perform the error correction decode process based on the combined codeword.

3. The apparatus of claim 2, wherein to generate the combined codeword comprises to average the second codeword with the revised codeword.

4. The apparatus of claim 1, wherein to perform the error correction decode process comprises to perform a low-density parity-check (LDPC) error correction decode process.

5. The apparatus of claim 1, wherein the controller is further to:
perform an error correction decode process on the second codeword; and
analyze a result of the error correction decode process to determine whether the second codeword contains uncorrectable errors.

6. The apparatus of claim 1, wherein the controller is further to write, in response to a write request received before the read request, the redundant set of codewords to the memory, wherein any codeword in the redundant set is equal to an XOR of every other codeword in the redundant set.

7. The apparatus of claim 1, wherein the controller is further to:
receive a write request prior to the read request;
determine that at least one cell in the memory is faulty;
determine a section in the second codeword that corresponds to the faulty cell;
flip the values of every bit in the determined section of the second codeword; and
write, in response to the write request, the second codeword to the memory.

8. The apparatus of claim 7, wherein the controller is further to store an indicator that the values have been flipped in the determined section.

9. The apparatus of claim 7, wherein the controller is further to perform an error correction encode process on a data set associated with the write request to generate the second codeword.

10. The apparatus of claim 9, wherein to perform the error correction encode process comprises to perform an LDPC error correction encode process.

11. The apparatus of claim 1, further comprising one or more of:
one or more processors communicatively coupled to the memory;
a display device communicatively coupled to a processor;
a network interface communicatively coupled to a processor; or
a battery coupled to the apparatus.

12. One or more non-transitory machine-readable storage media comprising a plurality of instructions stored thereon that, when executed, cause an apparatus to:
compare, in response to a read request, a first codeword associated with a redundant set of codewords stored in a memory of the apparatus to a second codeword selected from the set of redundant codewords to determine whether a section of the first codeword differs from a corresponding section of the second codeword by at least a predefined threshold amount, wherein the first codeword is generated from an XOR of remaining codewords in the redundant set, other than the second codeword, in response to a determination that the second codeword contains uncorrectable errors;

flip, in response to a determination that the section of the first codeword differs from the corresponding section of the second codeword by at least the predefined threshold amount, every bit in the section of the first codeword to produce a revised codeword; and perform an error correction decode process based on the revised codeword.

13. The one or more non-transitory machine-readable storage media of claim 12, wherein the plurality of instructions, when executed, further cause the apparatus to:

compare the revised codeword to the second codeword to determine differences between the revised codeword and the second codeword; and generate a combined codeword based on the comparison of the revised codeword and the second codeword, wherein the combined codeword includes confidence information in which bits that differ between the combined codeword and the second codeword are assigned a low confidence value and bits that do not differ are assigned a high confidence value; and wherein to perform an error correction decode process based on the revised codeword comprises to perform the error correction decode process based on the combined codeword.

14. The one or more non-transitory machine-readable storage media of claim 13, wherein to generate the combined codeword comprises to average the second codeword with the revised codeword.

15. The one or more non-transitory machine-readable storage media of claim 12, wherein to perform the error correction decode process comprises to perform a low-density parity-check (LDPC) error correction decode process.

16. The one or more non-transitory machine-readable storage media of claim 12, wherein the plurality of instructions, when executed, further cause the apparatus to:

perform an error correction decode process on the second codeword; and analyze a result of the error correction decode process to determine whether the second codeword contains uncorrectable errors.

17. The one or more non-transitory machine-readable storage media of claim 12, wherein the plurality of instructions, when executed, further cause the apparatus to write, in response to a write request received before the read request, the redundant set of codewords to the memory, wherein any codeword in the redundant set is equal to an XOR of every other codeword in the redundant set.

18. The one or more non-transitory machine-readable storage media of claim 12, wherein the plurality of instructions, when executed, further cause the apparatus to:

receive a write request prior to the read request;

determine that at least one cell in the memory is faulty;

determine a section in the second codeword that corresponds to the faulty cell;

flip the values of every bit in the determined section of the second codeword; and write, in response to the write request, the second codeword to the memory.

19. The one or more non-transitory machine-readable storage media of claim 18, wherein the plurality of instructions, when executed, further cause the apparatus to store an indicator that the values have been flipped in the determined section.

20. The one or more non-transitory machine-readable storage media of claim 18, wherein the plurality of instructions, when executed, further cause the apparatus to perform an error correction encode process on a data set associated with the write request to generate the second codeword.

21. A method comprising:

comparing, by a controller of an apparatus and in response to a read request, a first codeword selected from a redundant set of codewords stored in a memory of the apparatus to a second codeword associated with the set of redundant codewords to determine whether a section of the first codeword differs from a corresponding section of the second codeword by at least a predefined threshold amount, wherein the first codeword is generated from an XOR of remaining codewords in the redundant set, other than the second codeword, in response to a determination that the second codeword contains uncorrectable errors;

flipping, by the controller and in response to a determination that the section of the first codeword differs from the corresponding section of the second codeword by at least the predefined threshold amount, every bit in the section of the first codeword to produce a revised codeword; and performing, by the controller, an error correction decode process based on the revised codeword.

22. The method of claim 21, further comprising:

comparing, by the controller, the revised codeword to the second codeword to determine differences between the revised codeword and the second codeword; and generating, by the controller, a combined codeword based on the comparison of the revised codeword and the second codeword, wherein the combined codeword includes confidence information in which bits that differ between the combined codeword and the second codeword are assigned a low confidence value and bits that do not differ are assigned a high confidence value; and wherein performing an error correction decode process based on the revised codeword comprises performing the error correction decode process based on the combined codeword.

* * * * *